United States Patent [19]
Sato et al.

[11] Patent Number: 5,344,492
[45] Date of Patent: Sep. 6, 1994

[54] VAPOR GROWTH APPARATUS FOR SEMICONDUCTOR DEVICES

[75] Inventors: Mitsuo Sato, Zama; Kiyoshi Yoshikawa, Kawasaki; Yuusuke Sato, Tokyo, all of Japan

[73] Assignee: Kabushiki Kaisha Toshiba, Kawasaki, Japan

[21] Appl. No.: 89,526

[22] Filed: Jul. 21, 1993

[30] Foreign Application Priority Data

Jul. 23, 1992 [JP]  Japan ................................ 4-197101

[51] Int. Cl.$^5$ ............................................. C23C 16/00
[52] U.S. Cl. ....................... 118/725; 118/724; 118/730
[58] Field of Search ................ 118/725, 724, 730

[56] References Cited
FOREIGN PATENT DOCUMENTS

| | | | |
|---|---|---|---|
| 59-44819 | 3/1984 | Japan | 118/725 |
| 2-262331 | 10/1990 | Japan | 118/725 |
| 3235325 | 10/1991 | Japan | 118/725 |

*Primary Examiner*—Richard Bueker
*Attorney, Agent, or Firm*—Foley & Lardner

[57] ABSTRACT

A vapor growth apparatus has a susceptor which rotates in a water cooled reaction tube with holding semiconductor susbstrates thereon. A heater is provided in order to heat the susceptor and to maintain a predetermined temperature. This heater is comprised of an inner heater, which heats the inner part of the susceptor, and a peripheral heater, which heats the peripheral part of the susceptor. The peripheral heater is made thicker than the inner heater. In addition, these inner and peripheral heaters are connected in parallel with each other. So, the peripheral heater can generate more heat than the inner heater so as to compensate the temperature decrease in the peripheral part of the susceptor, without loosing the mechanical strength of the whole heater.

11 Claims, 8 Drawing Sheets

VAPOR GROWTH APPARATUS FOR SEMICONDUCTOR DEVICES

BACKGROUND OF THE INVENTION

1. Field of the Invention

This invention relates to a vapor growth apparatus for semiconductor devices, such as compound semiconductor devices. In particular, this invention relates to a vapor growth apparatus for growing thin films from vapor phase by the MOCVD (Metal Organic Chemical Vapor Deposition) method in which a water cooled reaction tube of the vertical type is used.

2. Description of the Prior Arts

Figures 6A, 6B:
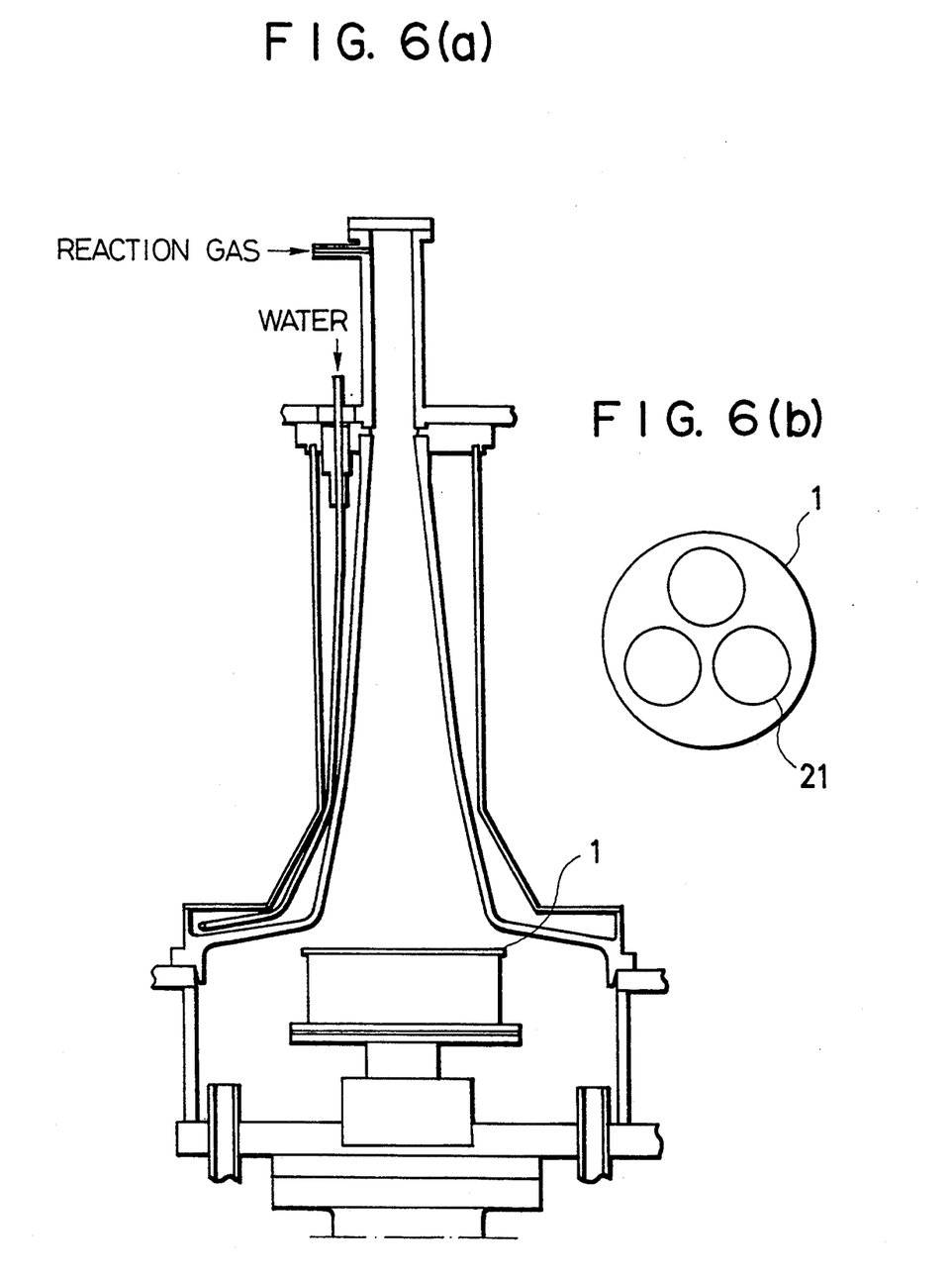

The cross-sectional view of a conventional vapor growth apparatus for semiconductor devices is shown in FIG. 6a. This apparatus has a water cooled reaction tube of the vertical type. As shown in FIG. 6b a plurality of semiconductor wafers (substrates) 21 are placed on a susceptor 1 which is in a disk-like form. These wafers 21 are then subjected to the MOCVD method in order to grow thin films on their surfaces.

Figure 7:
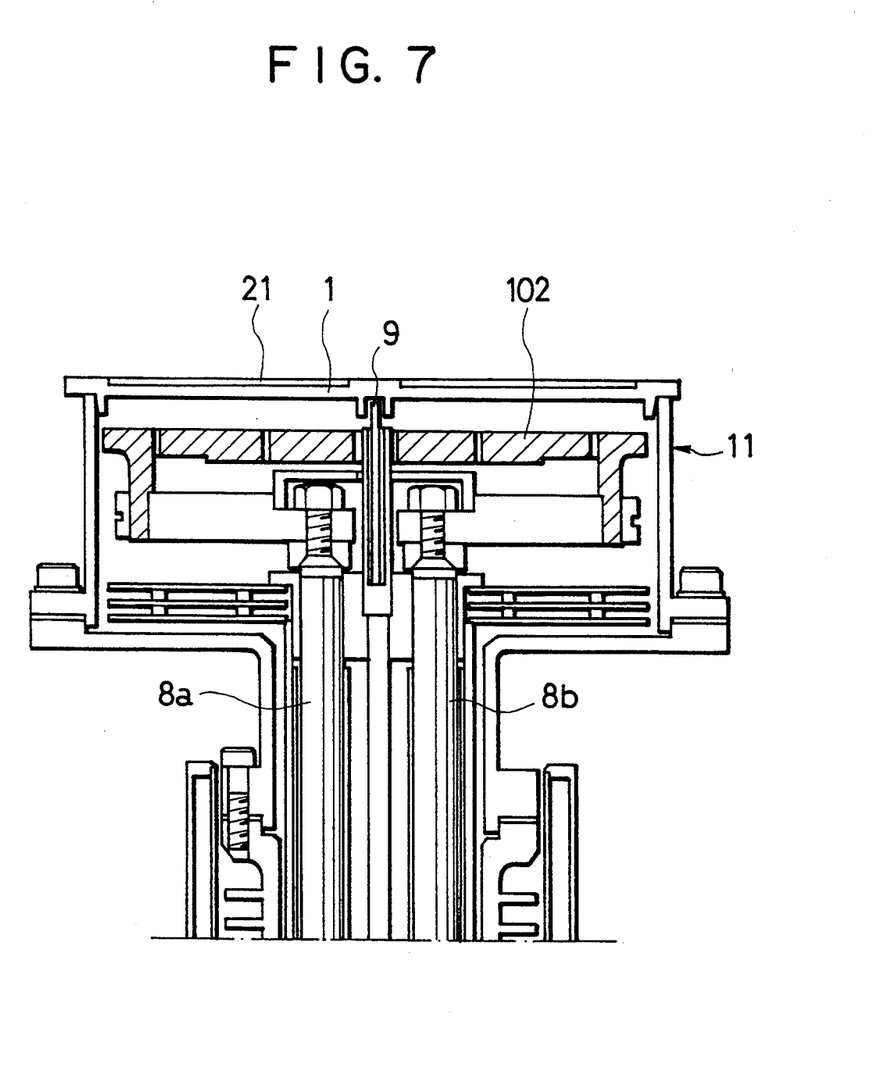
FIG. 7 is a cross-sectional view of the vapor growth apparatus according to one prior art of the present invention.
Figure 8A:
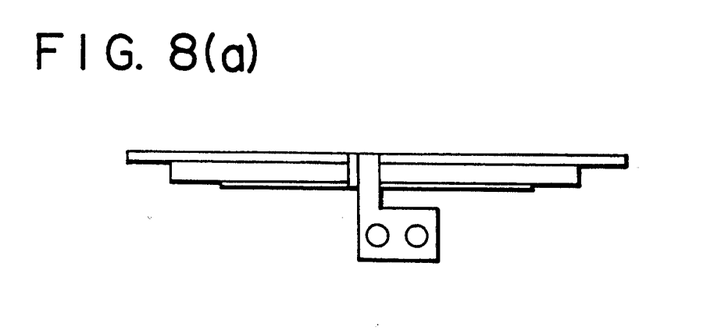
FIG. 8a is a side view of an integral heater which is used in the vapor growth apparatus of the prior art.
Figure 8B:
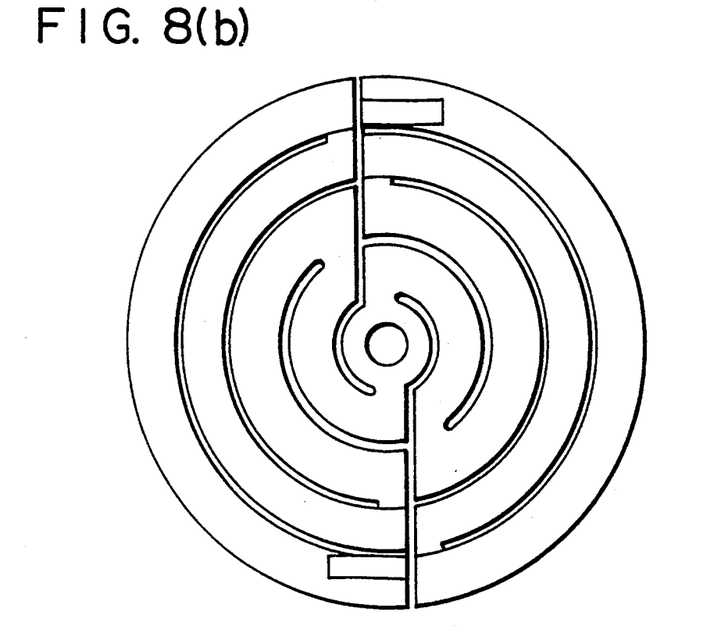
Figure 8C:
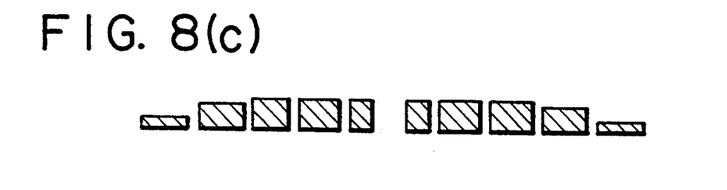
FIG. 8c is a cross-sectional view of the integral heater shown in FIGS. 8a and 8b.

FIG. 7 is a cross-sectional view showing the structure of the susceptor part contained in the prior art vapor growth apparatus mentioned above. FIGS. 8a, 8b, and 8c are the side view, the plan view, and the cross-sectional view of an integral type heater 102 used in the apparatus.

As shown in FIGS. 7 and 8, integral type heater 102 used in the prior art apparatus is installed in susceptor receiver 11 and connected with current supply terminals 8a and 8b.

Also, as shown in FIG. 6a, the reaction room contained in the apparatus has a shape such as that of a cone, in order to make reaction gas flow most suitable and to obtain the most suitable concentration gradient of the reaction gas. Accordingly, susceptor 1 is close to the lower part of the reaction room, the part which is wider than the upper part. Further, the reaction room is cooled by water so as to prevent the adhesion of products, which are generated by reaction, onto the inner wall. As a result, the thermal radiation from susceptor 1 is relatively large in this apparatus.

In addition, susceptor receiver 11 is placed around susceptor 1 such that receiver 11 holds susceptor 1 from its periphery. This susceptor receiver 11 is integrated into a rotator. Therefore, heat is released due to the thermal conduction from the peripheral part of susceptor 1 to receiver 11.

Moreover, the temperature of the peripheral part of susceptor 1 largely decreases due to the gas flow during a process of vapor growth. As a result, wafer characteristics of products, especially on the peripheral part of susceptor, become inhomogeneous. For example, in producing semiconductor lasers with this apparatus, the wavelength distribution of semiconductor laser oscillation, which is dependent on temperature, becomes scattered.

In order to overcome the problem arising from the temperature decrease, especially in the peripheral part of susceptor 1, heater 102 contained in the prior art apparatus should have a structure to generate more heat from its peripheral part than the inside part. To change the amount of heat generation, the cross-sectional area of carbon heater 102 should be changed. Accordingly, the cross-sectional area of heater 102 should be very small in the peripheral part so as to increase the heat generation, as shown in FIG. 8c. In this case, however, the mechanical strength of this heater decreases.

As explained above, the prior art vapor growth apparatus has the following disadvantages:

(1) the temperature of the peripheral part of the susceptor largely decreases, and thus, the characteristics (including the wavelength distribution of semiconductor laser oscillation) of individual products made of wafers become inhomogeneous;

(2) if the cross-sectional area of the heater is set to be small especially in the peripheral part so as to solve problem (1), the heat generation in this part increases, but the mechanical strength of the whole heater decreases.

SUMMARY OF THE INVENTION

This invention has been made to overcome the above mentioned problems of the prior art apparatus.

Therefore, one objective of the present invention is to provide a vapor growth apparatus for semiconductor devices which is capable of unifying the temperature distribution of a susceptor without losing the mechanical strength of a heater.

Another objective of the present invention is to provide a vapor growth apparatus using a water cooled reaction tube of the vertical type which can realize the uniform distribution of temperature in a susceptor without loosing the mechanical strength of a heater.

Still another objective of the present invention is to provide a vapor growth apparatus which is capable of obtaining many semiconductor devices, having the same or almost the same characteristics, at one fabrication process, by controlling the temperature distribution of a susceptor to be uniform, as far as possible. With such characteristics, for example, the oscillating wave length of semiconductor lasers is contained.

Figure 1:
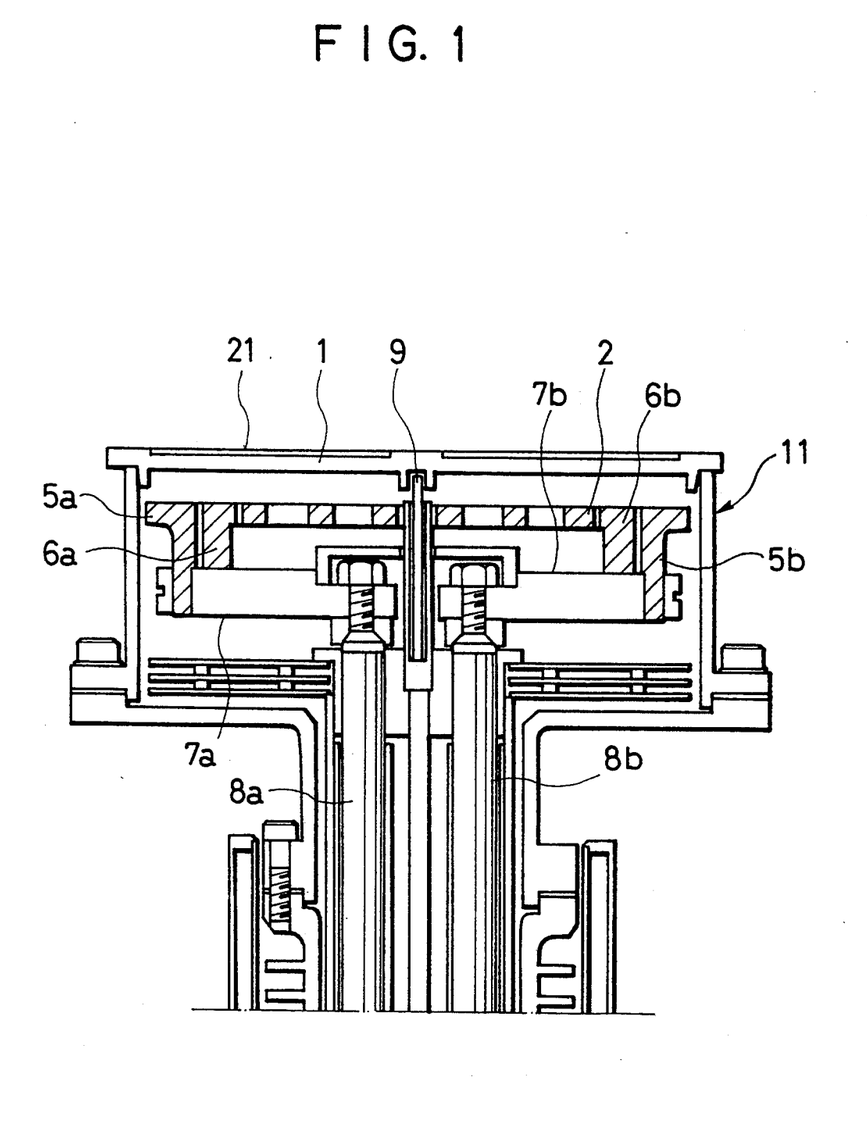
FIG. 1 is a cross-sectional view showing the susceptor part of a vapor growth apparatus according to one embodiment of this invention.

The first feature of the present invention is to provide a vapor growth apparatus for semiconductor devices which is comprised of the following as shown in FIG. 1: a susceptor 1 which rotates in a water cooled reaction room while holding semiconductor substrates 21 thereon; and a heater 2 for heating said susceptor 1; wherein said heater 2 is comprised of inner and peripheral heaters 3 and 4, which are electrically connected in parallel with each other.

The second feature of the present invention is to provide the vapor growth apparatus having the first feature, wherein the temperature of said peripheral heater 4 rises higher than that of inner heater 3.

Figures 2A, 2B, 2C:
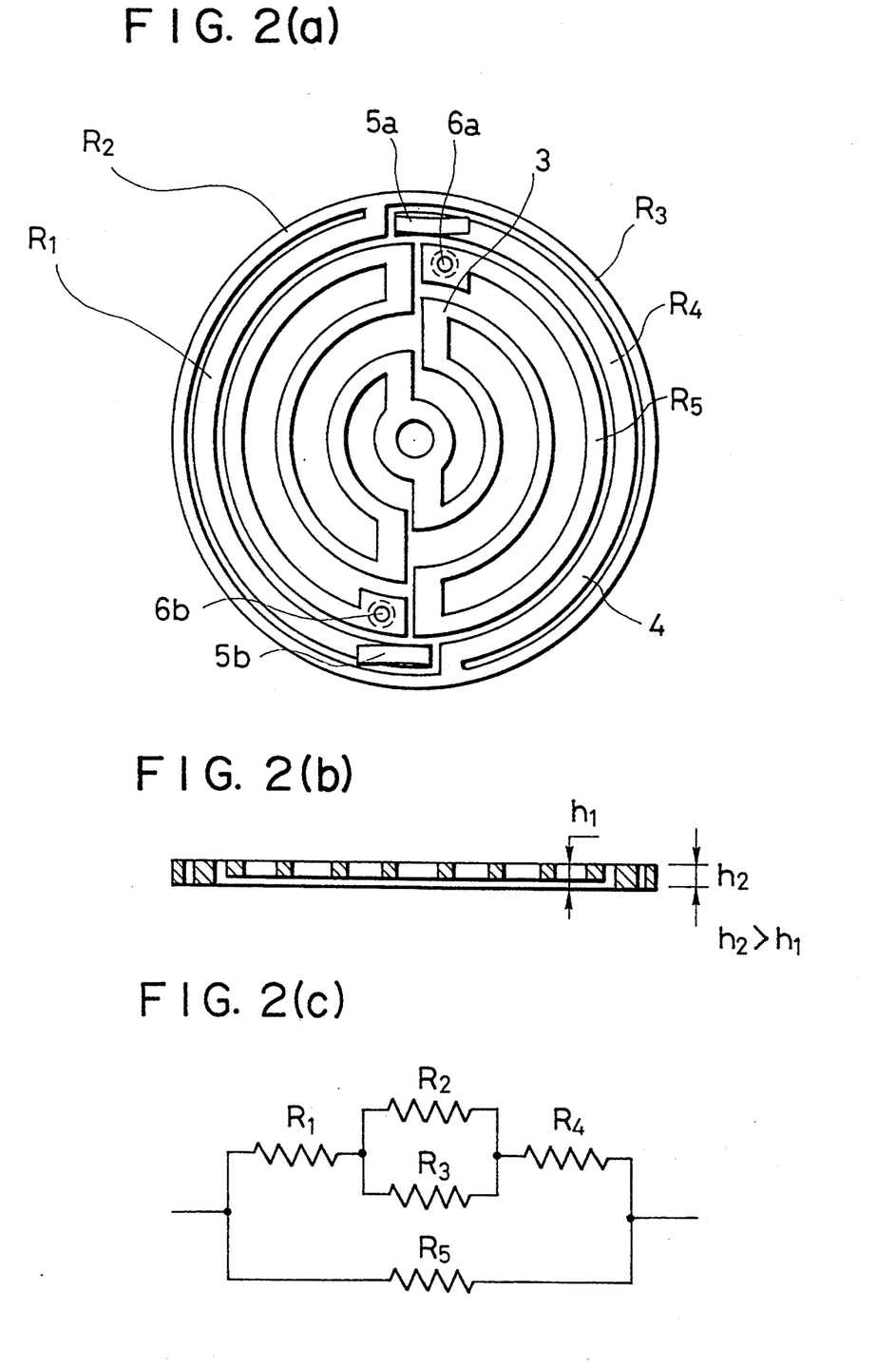
FIG. 2a is a plan view of the heater which is contained in the vapor growth apparatus shown in FIG. 1.
FIG. 2b is a cross-sectional view of the heater shown in FIG. 1.
FIG. 2c is a view showing the equivalent circuit for the heater shown in FIG. 1.

According to the first and second features of this invention, a plurality of semiconductor substrates (wafer) 21 are placed on susceptor 1 which rotates in the water cooled reaction tube of the vertical type, in order to carry out a vapor deposition. Heater 2 for heating susceptor 1 is, for example, in the form of a rectangle as shown in FIG. 2 and is divided into inner heater 3 and peripheral heater 4, which are electrically connected in parallel with each other and integrated into one structure. The temperature of peripheral heater 4 is controlled to be higher than that of inner heater 3 by one temperature controller (not shown).

As mentioned above, heater 2 of this invention is comprised of inner heater 2 and peripheral heater 3, which are connected in parallel with each other. Therefore, the lower the resistor value of peripheral heater 4 is, the more current flows through heater 4, thus increasing the amount of heat generation in heater 4. Accordingly, the cross-sectional area of peripheral heater 4 can be set larger than that of inner heater 3, in contrast to the prior art heater. Thus, the apparatus of this invention can make the temperature distribution of susceptor 1 uniform without losing the mechanical strength of heater 2. The apparatus of this invention can, therefore, grow many semiconductor devices whose wafer characteristics, such as the wave length distribution of laser oscillation, are homogeneous.

These and other objectives, features, and advantages of the present invention will be more apparent from the following detailed description of preferred embodiments in conjunction with the accompanying drawings.

BRIEF DESCRIPTION OF THE DRAWINGS

FIG. 3b is a plan view of the inner heater shown in FIG. 3a;

FIG. 4b is a plan view of the peripheral heater shown in FIG. 4a;

FIG. 6a is a cross-sectional view of the vapor growth apparatus having a water cooled reaction tube of the vertical type;

FIG. 6b is a plan view of the susceptor which holds semiconductor substrates thereon in the vapor growth apparatus shown in FIG. 6a;

FIG. 8b is a plan view of the integral heater shown in FIG. 8a; and

DETAILED DESCRIPTION OF EMBODIMENTS

In FIG. 1, the cross-sectional view of the susceptor part contained in a vapor growth apparatus is shown according to one embodiment of the present invention. In FIGS. 1 and 7, the same numbers show the same or the similar structure elements with each other. In the same manner as the prior art, the vapor growth apparatus of this embodiment is used in the water cooled reaction tube of the vertical type, the tube which has the cross-sectional structure shown in FIG. 6.

As shown in FIG. 1, the vapor growth apparatus of this embodiment is mainly comprised of the following: a susceptor 1 which rotates in a water cooled reaction room with holding semiconductor substrates thereon; a carbon heater 2 for heating susceptor 1; a pair of thermocouples 9 for detecting the real temperature of susceptor 1; and a susceptor receiver 11.

In FIGS. 2a, 2b, and 2c, the plan view, the cross-sectional view, and the equivalent circuit view of heater 2 are shown. As shown in these figures, heater 2 is divided into two parts, that is, inner heater 3 and peripheral heater 4. These heaters 3 and 4 are electrically connected in parallel and integrated into one structure.

Figure 3A:
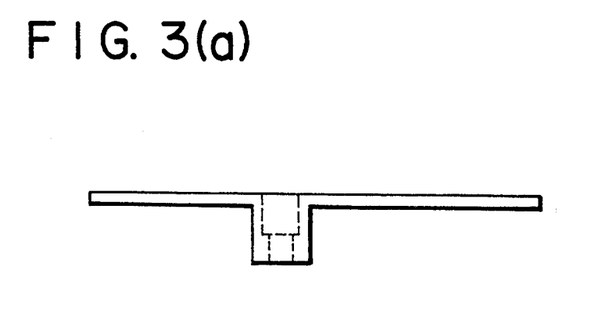
FIG. 3a is a side view of the inner heater which is a part of heater shown in FIGS. 2a, 2b, and 2c.
Figure 3B:
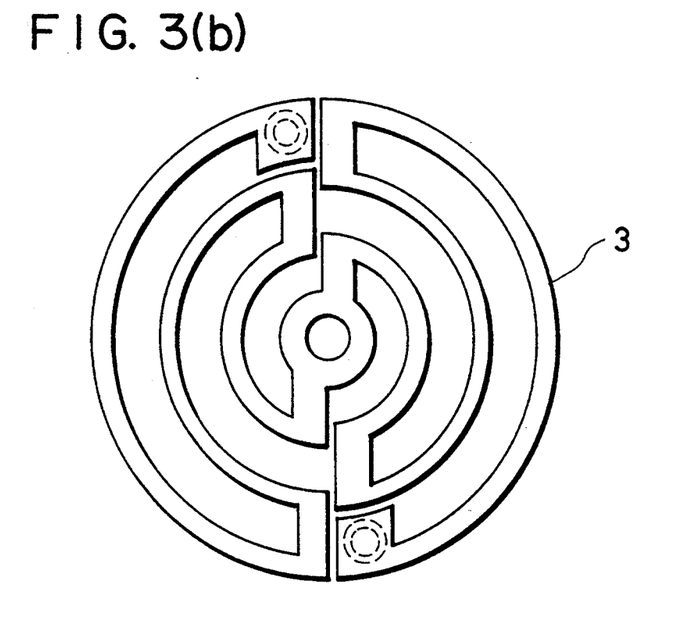
Figure 3C:
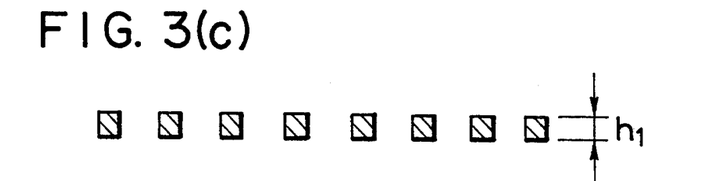
FIG. 3c is a cross-sectional view of the inner heater shown in FIGS. 3a and 3b.

FIGS. 3a, 3b, and 3c show the side, plan, and cross-sectional views of inner heater 3. As shown in these figures, inner heater 3 is comprised of a carbon heater having a thickness h1 of 3 mm. The the cross-sectional size of inner heater 3 is 2 mm×3 mm.

Figure 4A:
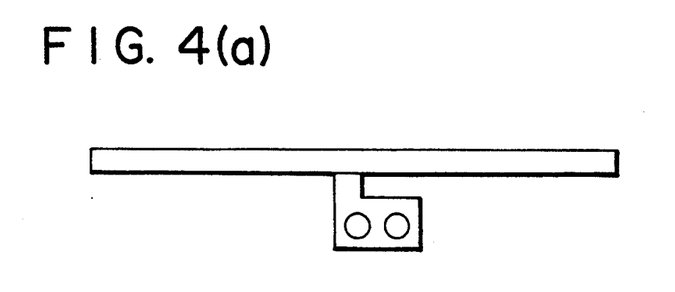
FIG. 4a is a side view of the peripheral heater which makes up the heater shown in FIGS. 2a, 2b and 2c with said inner heater shown in FIGS. 3a, 3b, and 3c.
Figure 4B:
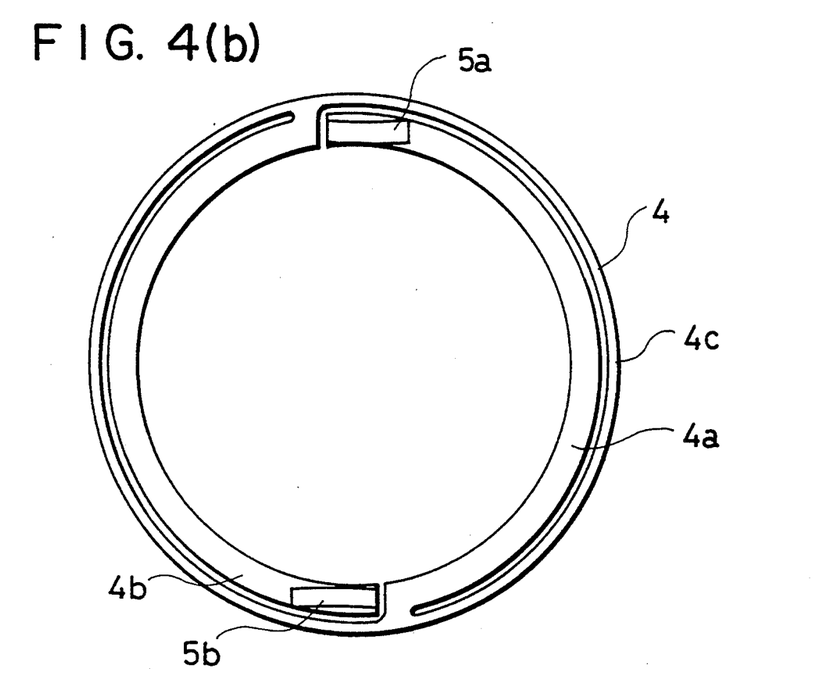
Figure 4C:
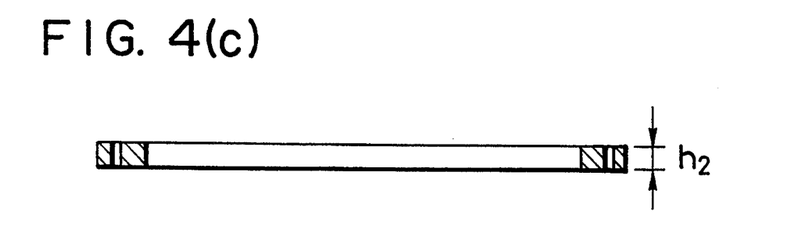
FIG. 4c is a cross-sectional view of the peripheral heater shown in FIGS. 4a and 4b.

FIGS. 4a, 4b, and 4c are the side, plan, and cross-sectional views of peripheral heater 4. The thickness h2 of peripheral heater 4 is 5 mm (h2>h1). This heater 4 is comprised of an outer circle 4c and inner semi-circles 4a and 4b which are separated at the central part. Connecting blocks 5a and 5b are fixed at each end of inner semi-circles, as shown in the figures. Also, these outer circle 4c and inner semi-circles 4a and 4b are connected with each other so as to compose a series-parallel circuit. In other words, the whole of peripheral heater 4 makes up a series-parallel circuit as shown in FIG. 2c. In this figure, resisters R2 and R3 are from outer circle 4c, resister R1 is from inner semi-circle 4a, and register R4 is from inner semi-circle 4b. In addition, resister R5 is from inner heater 3.

As mentioned above, heater 2 of this embodiment is comprised of inner heater 3 and peripheral heater 4, which are connected in parallel with each other. Therefore, the lower the resistance value of peripheral heater 4 is, the more current flows through heater 4. As a result, the amount of heat generation becomes large in heater 4. In this embodiment, in order to increase the generation of heat further, the inner circle is divided into semi-circles 4a and 4b as mentioned above, and a series-parallel circuit is formed with registers R1, R2, R3, and R4. In this embodiment, therefore, the cross-sectional area of heater 4 is made larger than that of heater 3, in order to decrease the resistance value of heater 4.

In addition, as shown in FIGS. 1 and 2, inner heater 3 is installed at intermediate panels 7a and 7b through connecting blocks 6a and 6b, respectively. Similarly, peripheral heater 4 is installed at intermediate panels 7a and 7b through connecting blocks 5a and 5b, respectively. These intermediate panels 7a and 7b are then connected with current supply terminals 8a and 8b.

The temperature control of heater 2 is carried out by one temperature controller (not shown). A pair of thermocouples 9, which is contained in susceptor 1 without touching the inner surface, detects the real temperature of susceptor 1, and then, the controller works to keep the susceptor temperature at a predetermined value (about 800° C.).

Peripheral heater 4 is designed to generate more heat than inner heater 3. Therefore, the temperature of peripheral heater 4 is controlled to be higher than that of inner heater 3.

Figure 5:
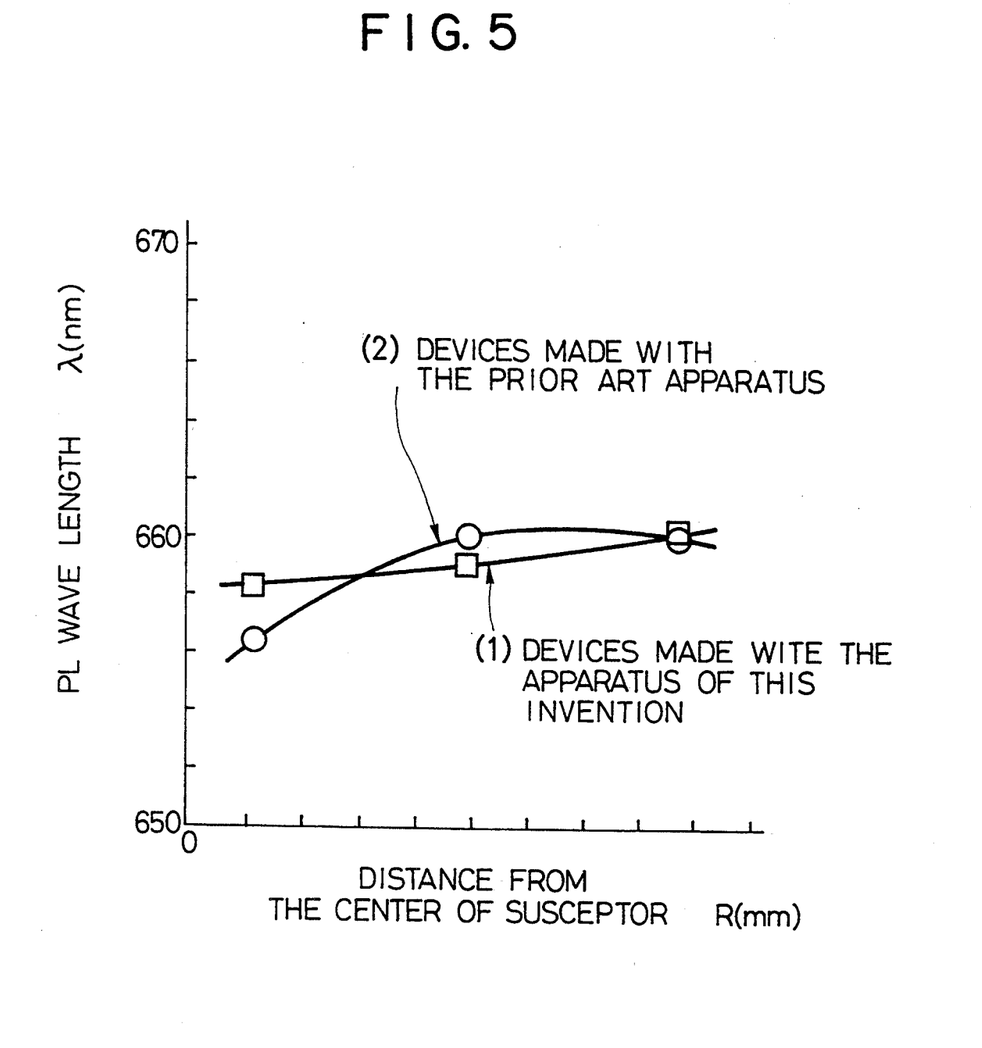
FIG. 5 is a view showing the relation between the oscillating wave lengths of semiconductor lasers and their distances from the center of the susceptor.

In FIG. 5, the experimental result is shown for the relation between the oscillating wave lengths $\lambda$ of semiconductor lasers and distances R from the center of susceptor 1. These semiconductor lasers are fabricated from semiconductor substrates obtained with the vapor growth apparatus of this embodiment and the prior art.

As is evident from the figure values λ of the semiconductor lasers, which are fabricated using prior art heater 102, have a dispersion within 4 nm. On the other hand, values λ of the semiconductor lasers which are fabricated using heater 2 of this embodiment, have a dispersion within 2 nm, which is half of the prior art value.

As described above, this embodiment has the following advantages:

(1) the temperature distribution of susceptor 1 has become uniform in this embodiment, thus decreasing the amount of characteristic dispersion (in oscillating wave length, etc.) among lasers made by the apparatus of this invention, such as ±1.0 nm, and so, greatly improving the production yield of the devices;

(2) heater 2 is made thicker than that of the prior art and is supported by four points, so that it is easy to handle without damaging;

(3) peripheral heater 4 and inner heater 3 are integrated into one structure by means of electric wirings, so that these heaters are controlled to maintain uniform temperature by one temperature controller of the conventional type; and (4) the characteristics of wafers, which have been placed on the peripheral part of susceptor 1 during a vapor growth process, have been improved, thus increasing the number of good quality pellets which are obtained from the wafers 21.

In summary, according to the present invention, the heater for heating a susceptor is divided into two parts, such as an inner heater and a peripheral heater. These two heaters are electrically connected in parallel with each other so as to integrate them into one structure. Also, these heaters are so controlled that the temperature of the peripheral heater becomes higher than that of the inner heater. Thus, this invention can have a heater which is thicker than that of the prior art apparatus. As a result, this heater can realize uniform temperature distribution on the susceptor without losing its mechanical strength. As a result, this invention provides a vapor growth apparatus which is capable of fabricating many semiconductor devices having uniform characteristics (the wave length distribution of oscillation, etc.).

What is claimed is:

1. A vapor growth apparatus for semiconductor devices, comprising:
    a susceptor which rotates in a water cooled reaction room while holding semiconductor substrates thereon; and
    a heater for heating said susceptor;
    wherein said heater comprises an inner and a peripheral heater electrically connected in parallel with each other.

2. The vapor growth apparatus as claimed in claim 1, wherein the temperature of said peripheral heater rises higher than that of said inner heater.

3. The vapor growth apparatus as claimed in claim 1, wherein the total resistance value of said peripheral heater is lower than that of said inner heater.

4. The vapor growth apparatus as claimed in claim 1, wherein said peripheral heater is thicker than said inner heater.

5. The vapor growth apparatus as claimed in claim 1, wherein the cross-sectional area of said peripheral heater is larger than that of said inner heater.

6. The vapor growth apparatus as claimed in claim 1, wherein said peripheral heater is comprised of an outer circle and two inner semi-circles, which are electrically connected so as to compose a series-parallel circuit.

7. The vapor growth apparatus as claimed in claim 1, wherein both ends of said inner and peripheral heaters are fixed to current supply terminals respectively through connecting blocks which are fixed to each end of said heaters.

8. A vapor growth apparatus for semiconductor devices, comprising:
    a susceptor which rotates in a water cooled reaction room with holding semiconductor wafers thereon;
    a first heater for heating the inner part of said susceptor; and
    a second heater for heating the peripheral part of said susceptor,
    said second heater having the total resistance value lower than that of said first heater.

9. The vapor growth apparatus as claimed in claim 8, wherein said second heater is further comprised of an outer circle and two inner semi-circles, which are connected to compose a series-parallel circuit.

10. The vapor growth apparatus as claimed in claim 8, wherein said second heater is thicker than said first heater.

11. A vapor growth apparatus for semiconductor devices, comprising:
    a susceptor which rotates in a water cooled reaction room while holding semiconductor substrates thereon;
    a heater for heating said susceptor; and
    a pair of current supply terminals for supplying said heater with electric current;
    wherein said heater comprises an inner and a peripheral heater electrically connected in parallel to each other.

* * * * *